United States Patent
Zilio et al.

(10) Patent No.: US 12,077,651 B2
(45) Date of Patent: Sep. 3, 2024

(54) GETTER COMPOSITION AND DISPENSABLE PASTE COMPRISING SAID GETTER COMPOSITION

(71) Applicant: SAES GETTERS S.P.A., Lainate (IT)

(72) Inventors: Stefano Zilio, Bareggio (IT); Anna Nuzzo, Maddaloni (IT); Giovanni Zafarana, Milan (IT); Giorgio Macchi, Gallarate (IT); Paolo Vacca, Milan (IT)

(73) Assignee: SAES GETTERS S.P.A., Lainate (IT)

( * ) Notice: Subject to any disclaimer, the term of this patent is extended or adjusted under 35 U.S.C. 154(b) by 0 days.

(21) Appl. No.: 18/273,600

(22) PCT Filed: Nov. 24, 2022

(86) PCT No.: PCT/EP2022/083095
§ 371 (c)(1),
(2) Date: Jul. 21, 2023

(87) PCT Pub. No.: WO2023/099326
PCT Pub. Date: Jun. 8, 2023

(65) Prior Publication Data
US 2024/0067798 A1    Feb. 29, 2024

(30) Foreign Application Priority Data
Nov. 30, 2021   (IT) .................. 102021000030299

(51) Int. Cl.
| | | |
|---|---|---|
| *C08L 63/00* | (2006.01) | |
| *C08K 3/34* | (2006.01) | |
| *C08K 11/00* | (2006.01) | |
| *C08L 63/02* | (2006.01) | |
| *C08L 63/04* | (2006.01) | |

(52) U.S. Cl.
CPC ............ *C08K 3/34* (2013.01); *C08K 11/00* (2013.01); *C08L 63/00* (2013.01); *C08K 2201/005* (2013.01); *C08L 2203/20* (2013.01)

(58) Field of Classification Search
None
See application file for complete search history.

(56) References Cited

U.S. PATENT DOCUMENTS

| | | | |
|---|---|---|---|
| 9,694,344 B2 | 7/2017 | Song et al. | |
| 10,475,714 B2* | 11/2019 | Corazza | ............... B01J 20/2805 |
| 2003/0164472 A1 | 9/2003 | Shepodd et al. | |
| 2014/0157620 A1 | 6/2014 | Pronovost et al. | |
| 2016/0190517 A1* | 6/2016 | Masuda | ............... H10K 50/854 257/40 |
| 2019/0267521 A1* | 8/2019 | Corazza | .................. H01L 23/26 |

FOREIGN PATENT DOCUMENTS

WO    WO-2017141159 A1    8/2017

OTHER PUBLICATIONS

International Search Report and Written Opinion issued Mar. 24, 2023 in PCT/EP2022/083095, 13 pages.
Italian Search Report issued Jul. 14, 2022 in Patent Application No. IT202100030299, 8 pages.

* cited by examiner

*Primary Examiner* — Michael J Feely
(74) *Attorney, Agent, or Firm* — Element IP, PLC

(57) ABSTRACT

Getter composition to be used for controlling the amount of moisture and organic gases in sealed electronic or optoelectronic devices, said composition comprising a blend of first getter and second getter powders in a weight ratio comprised between 0.1 and 5.0, wherein the first getter is polyphenylene oxide (PPO) or Poly(2,6-diphenyl-p-phenylene oxide) (PPPO) and the second getter is a Faujasite (FAU) zeolite or a mixture of a Faujasite (FAU) zeolite and a Linde Type A (LTA) zeolite with a ratio comprised between 0.1 and 5.0. The invention also relates to a dispensable paste comprising a resin and the getter composition.

14 Claims, No Drawings

GETTER COMPOSITION AND DISPENSABLE PASTE COMPRISING SAID GETTER COMPOSITION

The present invention relates to a dispersible getter composition to be used for controlling the amount of moisture and organic gases in sealed electronic or optoelectronic devices, and to a dispensable paste comprising said getter composition.

It is commonly known that electronic devices, and specifically some of their components, are sensitive to, and show decreased performance, when exposed to undesirable contaminants including moisture and other contaminant gases such as oxygen, hydrogen, and volatile organic compounds (VOCs).

In the state of the art, the main techniques for preserving organic electronic devices (i.e. electronic devices with organic components) from degradation include applying a barrier coat or sealant along the borders of the organic electronic device in order not to allow the contaminant to enter into it, this in combination with the placing of an absorbent or adsorbent getter material inside the sealed device in order to remove the contaminants into its internal sealed volume.

The main desiccants employed for water removal usually include metal oxides (such as CaO, BaO, MgO); metal hydrides; metal salts; powdered zeolites (such as 4A and 3A molecular sieves); metal perchlorates; superabsorbent polymers and metals that react with water, such as calcium.

EP1874885, for example, discloses radiation-curable desiccant-filled adhesives or sealants disposed on the electronic and optoelectronic devices perimeter, with a desiccant filler used as moisture scavenging or barrier features. Also WO2013165637, provides radiation- or heat-curable encapsulants suitable for sealing and adhering substrates and covers of organic electronic devices to protect the active organic components of the device from moisture and oxygen using one of the desiccant fillers reported above.

US20060283546 relates to a method for encapsulating electronic devices and consequently sealing the electronic device, including a hybrid getter material prepared with zeolite getter powders combined with a polyimide resin.

In addition to the moisture barrier aim, some applications report solutions aimed at ensuring the absorption of volatile organic chemical compounds (VOCs), such as WO2008033647 and WO2010093237 which disclose optoelectronic devices with electrically insulating material not permeable to VOCs selected among substituted or unsubstituted carbon compounds including alkanes, cycloalkanes, aromatic compounds, alcohols, ethers, esters, ketones, halocarbons, amines, organic acids, cyanates, nitrates, and nitriles. In both cases, the desiccant effect is reached by using a variety of sorbent media such as activated carbon, alumina and other metal oxides, zeolites, organic sorbents including hyper-crosslinked systems.

One of the main goals in this field is to effectively reduce and control simultaneously the amount of water and organic gases but, as a drawback, most of the typical getters and fillers employed can reduce their effect with respect to some species when in competition with others.

It has been surprisingly found by our inventors that, when Faujasite (FAU) zeolites or a mixture of FAU and Linde Type A (LTA) zeolites are combined with polyphenylene oxide (PPO) or Poly(2,6-diphenyl-p-phenylene oxide) (PPPO) species in a specific ratio, the negative effect of VOCs on the zeolite water adsorption significantly decreases and despite the presence of VOC species, the water adsorption capacity remains substantially unchanged (i.e. is within the margin of error in the measurement). Moreover, at the same time, the negative effect of water on the VOC adsorption capacity is not reported and the composition herein disclosed does not show a decrease of VOC adsorption despite the water presence.

Therefore, the object of the present invention is a dispersible getter composition comprising a blend of a first getter and a second getter, wherein the first getter is PPO or PPPO and the second getter is a Faujasite (FAU) zeolite or a mixture of FAU and Linde Type A (LTA) zeolites. Specifically, said composition is characterized by a ratio between the first getter and the second getter comprised between 0.1 and 5.0, preferably between 0.1 and 2.5. As used herein, the word "between," when used to describe a numerical range, includes the endpoints of that range. Compositions characterized by higher ratios do not provide a significant water adsorption, which results undetectable with conventional measurement techniques.

Moreover, the getter composition is in the form of powders with a controlled particle size distribution characterized by an $X_{90}$ value comprised between 1.0 and 50.0 μm (calculated from volume distribution). In a further preferred embodiment, said particle size distribution is characterized by an $X_{90}$ value comprised between 1.0 and 20.0 μm.

A further advantage related to the present invention is connected to the possibility to introduce said composition in a device, and consequently remove from the inside of the device both moisture and organic compounds which may be present as residues of the manufacturing process or produced during the operation of the device. With respect to that, in order to improve the possibility to introduce the getter inside the device, said composition should be dispersed in a matrix, i.e. it may be combined with a resin in order to prepare a dispensable paste.

Specifically, the getter blend herein disclosed can be dispersed in an epoxy or a phenolic resin or a mixture thereof, and used in a dispensable paste in an amount comprised between 10% wt and 50% wt with respect to the paste total amount including the curing agent for the resin. In order to have a dispensable paste, the composition is characterized by a ratio between the first and the second getter comprised between 0.1 and 5.0, preferably between 0.1 and 2.5.

Since one of the targets in the VOC adsorption is to have a solventless formulation, said resin is essentially based on an epoxy resin selected among bisphenol F or bisphenol A, or a phenolic resin as a Poly[(phenyl glycidyl ether)-co-formaldehyde], or a mixture thereof, in an amount comprised between 50% wt and 90% wt of the resin total amount (including the curing agent).

In order to improve the viscosity and consequently the dispensability of the paste, the FAU zeolite can be mixed with a Linde Type A (LTA) zeolite with a ratio between the FAU zeolite and the LTA zeolite comprised between 0.1 and 5.0.

Moreover, additional compounds may be added to the paste, such as colorant molecules selected among rare earth pigments and organic heterocyclic compounds, in an amount comprised between 0.1% wt and 10% wt of the paste total amount for improving the visibility of the paste when applied on a surface.

The dispensable paste according to the present invention is suitable to be dispensed through the methods commonly used in manufacturing and laboratory processes, such as pneumatic syringe dispensing systems.

A further object of the present invention is also a component for electronic device, comprising at least one surface to which the paste has been dispensed.

In a preferred embodiment said component of the electronic device, with a surface that is at least partially covered with a paste according to the present invention, is a cover lid for the hermetic packaging of the electronic device.

Hereinafter, the invention will be explained in more detail with reference to the following non-limiting examples. Modifications or variations of the embodiments here exemplified, obvious to an expert in the art, are encompassed by the appended claims.

EXAMPLES

The getter powders blends of samples S1-S3 and comparative examples C1-C4 reported in Table 1 are prepared by mixing manually the pure getter powders. The adsorption capacity is measured using state-of-the-art systems, mass spectrometer ($H_2O$ and VOCs depletion).

To produce the dispensable paste of samples S4-S10 and comparative examples C5-C8 shown in Table 2, the resin plus the curing agent (45-65% wt) and the getter powders blends (35-55 wt %) are manually mixed in the amounts specified in the table in 10 g batches and then refined with appropriate devices, e.g. using a laboratory three-roll mill for 5 minutes.

Both the samples and the comparative examples where prepared by using polyphenylene oxide (PPO) as first getter since it is commonly know the equivalent behavior with respect to Poly(2,6-diphenyl-p-phenylene oxide) (PPPO) (see for example "*Monolithic Aerogels Based on Poly(2,6-diphenyl-1,4-phenylene oxide) and Syndiotactic Polystyrene*", ACS Appl. Mater. Interfaces 2013, 5, 12, 5493-5499).

The particle size distribution of the dry powders is measured with a laser diffraction instrument. The dispensability test is performed using a pneumatic dispensing system connected to a standard pneumatic line, with cylindrical needles from 300 to 800 μm diameter.

The dispensability is visually confirmed and labelled/marked as:

"BEST" if the flow from the syringe is continuous and the paste deposit is uniform.

"OK" if the maximum pressure (5-6 bar) from a standard pneumatic line is needed.

"BAD" if the paste is too viscous and so it is not uniform after refining: it cannot be dispensed.

TABLE 2

| Ref. | PPO (% wt) | FAU (% wt) | LTA (% wt) | Total filler (% wt) | FAU/LTA | Dispensability results |
|---|---|---|---|---|---|---|
| S4 | 6 | 18 | 16 | 40 | 1.1 | BEST |
| S5 | 8 | 20 | 18 | 46 | 1.1 | OK |
| S6 | 6 | 3 | 26 | 35 | 0.1 | BEST |
| S7 | 7 | 31 | 7 | 45 | 4.4 | OK |
| S8 | 25 | 5 | 5 | 35 | 1.0 | OK |
| S9 | 5 | 16 | 14 | 35 | 1.1 | BEST |
| S10 | 5 | 16 | 14 | 35 | 1.1 | BEST |
| C5 | 10 | 23 | 22 | 55 | 1.0 | BAD |
| C6 | 7 | 34 | 4 | 45 | 8.5 | BAD |
| C7 | 0 | 50 | 0 | 50 | — | BAD |
| C8 | 39 | 4 | 3 | 46 | 1.3 | BAD |

The reported results clearly show the technical effect of the invention; indeed, as reported in comparative example C3, it is possible to confirm the negative effect of VOCs on the FAU zeolite water adsorption capacity, which decreases by 10% when the getter composition is exposed to both toluene and water. On the contrary, when samples S1-S3 prepared according to the present invention are tested, despite the VOC presence, the relative water adsorption does not significantly change with respect to the expected capacity calculated on the base of the amount of the different species (PPO, FAU and LTA) and their relative intrinsic capacity, the largest change being about 2.8% for S3.

As confirmed by the results reported in Table 1, it is well known that good adsorption capacity may be obtained when the simple FAU zeolite is tested as getter, however the simple zeolites are not suitable to be dispersed in sufficient amount to be effective in the applications of interest. As shown in samples S2 and S3, it is possible to add a second zeolite (LTA) while maintaining the positive effect on the water adsorption; in contrast, as reported in comparative example C4, when only the LTA zeolite is employed combined with PPO, the toluene adsorption capacity decreases with respect to the value which can be obtained when the FAU zeolite is employed as second getter.

In Table 2 it is possible to see the quality evaluation of pastes S4-S10 comprising a getter composition prepared according to the present invention, in particular S4 being the paste comprising composition S3. The reported results also demonstrate the possibility to employ different resins, indeed both S4-S8 samples, prepared by using bisphenol F resin, and S9-S10 respectively prepared with bisphenol A and a Poly[(phenyl glycidyl ether)-co-formaldehyde] resins, demonstrate good dispensability. At the same time, considering the comparative examples, it is clear that when the amount of filler is higher than 50% (C5), or the ratio between FAU and LTA zeolite is too high, indicatively higher than 5.0 (C6), or the second zeolite LTA is not present in the

TABLE 1

| Ref. | PPO (wt %) | FAU (wt %) | LTA (wt %) | Expected $H_2O$ capacity (% wt) | $H_2O$ capacity (in $H_2O$ + toluene) (% wt) | Expected toluene capacity (% wt) | Toluene capacity (in $H_2O$ + toluene) (% wt) |
|---|---|---|---|---|---|---|---|
| C1 | 0 | 0 | 100 | 23.1 | 23.1 | undetectable | undetectable |
| C2 | 100 | 0 | 0 | undetectable | undetectable | 14.9 | 13.8 |
| C3 | 0 | 100 | 0 | 27.3 | 24.6 | 21.9 | 23.0 |
| C4 | 67 | 0 | 33 | 7.6 | 8.4 | 10.0 | 10.5 |
| S1 | 50 | 50 | 0 | 13.6 | 13.9 | 18.4 | 15.3 |
| S2 | 50 | 25 | 25 | 12.6 | 12.5 | 12.9 | 11.8 |
| S3 | 15 | 45 | 40 | 21.5 | 20.9 | 12.1 | 12.3 | composition (C7), or the ratio between the first and the second getter is higher than 5.0 (C8), it is not possible to obtain a dispensable paste.

The invention claimed is:

1. A dispensable paste, comprising:
an epoxy resin; and
a getter composition comprising a blend of a first getter powder and a second getter powder, wherein:
the first getter powder is polyphenylene oxide (PPO) or poly(2,6-diphenyl-p-phenylene oxide) (PPPO);
the second getter powder is a Faujasite (FAU) zeolite or a mixture of a Faujasite (FAU) zeolite and a Linde Type A (LTA) zeolite having a weight ratio FAU to LTA of 0.1 to 5.0;
a weight ratio of the first getter powder to the second getter powder is 0.1 to 5.0; and
the getter powders have a particle size distribution $X_{90}$ of 1.0 to 50.0 µm;
and wherein:
the resin, including any curing agent, is present in an amount of 50 to 90 wt % based on a total weight of the paste; and
the getter composition is present in an amount of 10 to 50 wt % based on the total weight of the paste.

2. The dispensable paste according to claim 1, further comprising one or more colorant compounds in an amount 0.1 to 10 wt % based on the total weight of the paste.

3. The dispensable paste according to claim 2, wherein the one or more colorant compounds comprise at least one selected from the group consisting of a rare earth pigment and an organic heterocyclic compound.

4. The dispensable paste according to claim 3, wherein:
the epoxy resin comprises at least one selected from the group consisting of a bisphenol F epoxy resin, a bisphenol A epoxy resin, and a poly[(phenyl glycidyl ether)-co-formaldehyde] resin.

5. The dispensable paste according to claim 3, wherein the weight ratio of the first getter powder to the second getter powder is 0.1 to 2.5.

6. The dispensable paste according to claim 2, wherein:
the epoxy resin comprises at least one selected from the group consisting of a bisphenol F epoxy resin, a bisphenol A epoxy resin, and a poly[(phenyl glycidyl ether)-co-formaldehyde] resin.

7. The dispensable paste according to claim 2, wherein the weight ratio of the first getter powder to the second getter powder is 0.1 to 2.5.

8. The dispensable paste according to claim 1, wherein:
the epoxy resin comprises at least one selected from the group consisting of a bisphenol F epoxy resin, a bisphenol A epoxy resin, and a poly[(phenyl glycidyl ether)-co-formaldehyde] resin.

9. The dispensable paste according to claim 8, wherein the weight ratio of the first getter powder to the second getter powder is 0.1 to 2.5.

10. The dispensable paste according to claim 1, wherein the weight ratio of the first getter powder to the second getter powder is 0.1 to 2.5.

11. The dispensable paste according to claim 1, wherein the getter powders have a particle size distribution $X_{90}$ of 1.0 to 20.0 µm.

12. The dispensable paste according to claim 1, wherein the first getter powder is polyphenylene oxide (PPO) and the second getter powder is a mixture of Faujasite (FAU) zeolite and Linde Type A (LTA) zeolite having a weight ratio FAU to LTA of 0.1 to 5.0.

13. A component for an electronic device, comprising at least one surface on to which the paste according to claim 1 has been dispensed.

14. The component according to claim 13, wherein the component is a cover lid for hermetic packaging of the electronic device.

* * * * *